United States Patent [19]

Aronowitz et al.

[11] Patent Number: 5,538,907
[45] Date of Patent: Jul. 23, 1996

[54] METHOD FOR FORMING A CMOS INTEGRATED CIRCUIT WITH ELECTROSTATIC DISCHARGE PROTECTION

[75] Inventors: Sheldon Aronowitz; Rosario Consiglio, both of San Jose; Abraham Yee, Santa Clara, all of Calif.

[73] Assignee: LSI Logic Corporation, Milpitas, Calif.

[21] Appl. No.: 241,358

[22] Filed: May 11, 1994

[51] Int. Cl.$^6$ .................................... H01L 21/265
[52] U.S. Cl. .................. 437/34; 437/44; 437/154
[58] Field of Search .................... 437/34, 35, 44, 437/149, 150, 154, 157, 158

[56] References Cited

U.S. PATENT DOCUMENTS

| | | | |
|---|---|---|---|
| 4,734,752 | 3/1988 | Liu et al. | 307/304 |
| 4,739,378 | 4/1988 | Ferrari et al. | 361/56 |
| 4,855,620 | 8/1989 | Duvvury et al. | 307/448 |
| 4,859,620 | 8/1989 | Wei et al. | 437/44 |
| 4,952,994 | 8/1990 | Lin | 361/56 |
| 4,987,465 | 1/1991 | Longcor et al. | 361/91 |
| 5,017,985 | 5/1991 | Lin | 361/56 |
| 5,027,252 | 6/1991 | Yamamura | 361/58 |
| 5,162,966 | 11/1992 | Fujihira | 257/140 |
| 5,173,755 | 12/1992 | Co et al. | 257/361 |
| 5,223,737 | 6/1993 | Canclini | 257/546 |
| 5,270,226 | 12/1993 | Hori et al. | 437/44 |
| 5,349,225 | 9/1994 | Redwine et al. | 437/44 |

FOREIGN PATENT DOCUMENTS

| | | | |
|---|---|---|---|
| 0198763 | 11/1984 | Japan | 437/44 |
| 0054537 | 2/1990 | Japan | 437/44 |
| 0053234 | 2/1992 | Japan | 437/44 |

Primary Examiner—Tuan H. Nguyen
Attorney, Agent, or Firm—Poms, Smith, Lande & Rose

[57] ABSTRACT

A CMOS integrate circuit has improved protection to damage from electrostatic discharge (ESD) events because the circuit is formed with a virtual lateral bipolar transistor submerged in the morphology of the integrated circuit beneath an active circuit element of the circuit, and being formed by impurity atoms implanted into the substrate structure as ions which disperse laterally to form a dispersed charge permeation zone through which surge current from an ESD is conducted safely at a current level sufficiently low that the substrate material of the integrated circuit is not damaged. The integrated circuit may be formed with an intrinsic zener diode having a reverse bias breakdown voltage high enough to not interfere with the normal operation of the integrated circuit, and low enough to allow surge current from an ESD event to safely flow to ground potential.

6 Claims, 4 Drawing Sheets

METHOD FOR FORMING A CMOS INTEGRATED CIRCUIT WITH ELECTROSTATIC DISCHARGE PROTECTION

BACKGROUND OF THE INVENTION

1. Field of the Invention

The present invention is in the field of electrostatic discharge (ESD) protection for integrated circuits. More particularly, the present invention is in the field of electrostatic discharge protection for a metal oxide semiconductor (MOS) integrated circuit.

2. Related Technology

A conventional integrated circuit with punch through electrostatic discharge protection is seen in U.S. Pat. No. 4,734,752, issued 29 Mar. 1988, to Y. Liu, et al. The '752 patent is believed to disclose an electrostatic discharge protection structure in which a FET is provided, and which operates in a punch through mode. The FET is of conventional construction.

Another conventional integrated circuit electrostatic discharge protection structure is seen in U.S. Pat. No. 4,987,465, issued 22 Jan. 1991, to S. Longcor, et al., in which a pair of clamping structures cooperate to conduct ESD currents to ground. The clamping structures may be a lateral bipolar transistor, a MOS device, or a MOS device with a ballast resistor. The required structures for this ESD scheme appear complex, and would probably be expensive to produce in practice.

Still another ESD protection structure is seen in U.S. Pat. No. 5,027,252, issued 25 Jun. 1991, to R. Yamamira. This patent is believed to teach an ESD structure in which a pair of transistors in punch through mode are arranged with a first of these transistors having its gate terminal connected to an input pad of the device, and the second of these transistors has its gate terminal at ground potential of the device. Again, the structure necessary to realize this ESD scheme is quite complex, and expensive.

U.S. Pat. No. 4,739,378, is believed to teach an ESD scheme in which a pair of zener junctions are buried beneath a pad of the circuit device. The zeners are arrange in opposite polarity direction between the pad and ground, and are created by buried doping layers including a layer of one dopant type and a pair of vertically extending doping regions of opposite dopant type extending downwardly from the pad to the buried dopant layer, and forming the zener junctions.

Yet another ESD structure is seen in U.S. Pat. No. 5,162,966, issued 10 Nov. 1992, to T. Fujhira. This patent is believed to teach a circuit structure in which a zener diode is formed and connected to the gate of a lateral FET to switch this FET in the event of a ESD event so that surge current from the event is conducted to ground via the zener and FET.

U.S. Pat. No. 5,173,755, issued 22 Dec. 1992, is believed to teach an ESD structure in which a capacitively coupled zener diode is connected to a lateral bipolar transistor formed in a thick oxide film of the circuit device. The conduction of charge past the zener during an ESD event switches on the lateral bipolar, so that surge current from the ESD event is conducted to ground.

Still another ESD device is taught by U.S. Pat. No. 5,223,737, issued 29 Jun. 1993, in which a zener diode is believed to provide a base bias to a lateral bipolar transistor. The current conduction of the zener during an ESD event switches on the transistor so that ESD surge current is conducted to ground.

U.S. Pat. No. 5,017,985, issued 21 May 1991 is believed to show an ESD structure in which an insulated gate FET provides a conductive path to ground in the event of an ESD to a contact pad of the device.

Also, U.S. Pat. No. 4,855,620, issued 8 Aug. 1989, is believed to teach an ESD protection structure in which an FET is embedded in the field oxide of a circuit device, and is switched on during a ESD event to shunt surge current to ground, or to a controlled voltage source.

Many of the ESD schemes and structures discussed above are complex, and expensive to manufacture. Many of these ESD circuits rely on the cooperation of several circuit elements to achieve their desired result, and are influenced in the level or degree of protection which they provide by variations in the values of the various components of the ESD circuit.

SUMMARY OF THE INVENTION

In view of the deficiencies of the related technology, the present invention has as a primary object the providing of improved electrostatic discharge protection for an MOS integrated circuit.

Further, the present invention has as an object the provision of a MOS integrated circuit with a dispersed charge dissipation or charge permeation zone which effectively short circuits electrostatic discharges to ground or to a source of controlled voltage level by the action of charge carriers in a depletion zone. This charge permeation zone has the effect of a buried lateral bipolar transistor which is formed by confronting and laterally spreading ion implantation regions of the circuit device.

Another object for the present invention is to provide a method of making such an integrated circuit with a dispersed charge dissipation zone.

Still another object for the present invention is to provide an integrated circuit with an intrinsic zener diode having a reverse voltage current conducting level low enough to provide effective electrostatic discharge protection for the circuit, and high enough to allow normal operation of the circuit without adverse influence because of the presence of the intrinsic zener diode.

An object of the present invention is to provide a method of making such an integrated circuit with a cost-effective intrinsic zener diode for protection of the circuit from electrostatic discharge.

Still another object for the present invention is to provide such an intrinsic zener diode in a MOS integrated circuit, which intrinsic zener is formed by the intentional shifting in relative position of two masks used in the manufacturing process of the MOS integrated circuit.

Accordingly, the present invention provides according to a first aspect of the invention, a MOS integrated circuit having improved electrostatic discharge protection including a semiconductor material substrate and a first region of the substrate which is doped with a corresponding first conductivity type of doping impurity. According to one aspect of the present invention, a dispersed surge-current or charge permeation zone is provided in the substrate of the integrated circuit at a depth below an active circuit element, and through which an electrostatic discharge may be safely conducted to ground or to a source of controlled voltage potential. The dispersed surge current zone has the effect of a buried lateral bipolar transistor with a depletion region which becomes conductive in response to the ESD event. Another aspect of the invention provides a cost-effective intrinsic tunneling zener diode created by an intentional shifting of masks used during the manufacturing process for the integrated circuit. The intrinsic zener diode is designed to have a reverse-current voltage low enough to provide effective electrostatic discharge protection for the integrated circuit, and yet high enough that the presence of the intrinsic zener diode does not interfere with the normal operations of the integrated circuit.

In one embodiment of the present invention a pair of spaced apart second regions of the substrate are each doped with a respective second opposite conductivity type of doping impurity. The first doped region defines a conductive channel extending between and connecting the pair of second regions and the channel has a certain channel length. A gate structure is juxtaposed with the conductive channel to control electron flow therein in response to voltage applied to the gate structure. The integrated circuit further includes a pair of second regions defining a pair of underlying finger portions extending toward one another to define a spacing therebetween which is less than the length of the channel. These finger portions cooperatively define a dispersed charge permeation zone extending between the pair of fingers below the channel. The fingers in cooperation with the intervening region of first conductivity type form a virtual bipolar transistor connecting one of the pair of second doped regions to ground in response to conduction in the virtual transistor.

According to another aspect of the present invention, the invention provides a MOS integrated circuit having improved protection against damage from electrostatic discharge (ESD) events, the integrated circuit includes a semiconductor substrate material, and adjacent P-well and N-well structures formed in the substrate material at a surface thereof. Each of the P-well and N-well structures including impurity atoms of respective conductivity types implanted into the substrate material. The adjacent P-well and N-well structures cooperatively defining a diode junction, and a pair of sub-regions are implanted one into each one of the adjacent P-well and N-well, and are each of the same conductivity type as the respective well in which the sub-region is implanted. These sub-regions provide electrical connection to an active circuit element of the CMOS device. Each of the sub-regions has a concentration of the respective conductivity type impurity atoms which differs from its respective well, and the less electrically active one of these impurity atoms of the sub-regions is present in a concentration not less than $3\times10^{17}$ impurity atoms/cm$^3$. The result is that the pair of sub-regions cooperate to define an intrinsic zener diode connecting the pair of sub-regions and having a reverse bias breakdown voltage sufficiently low so as to conduct an ESD surge current between the sub-regions to protect the connected CMOS circuit element from the ESD event.

A method of making a MOS integrated circuit according to the first aspect of the present invention includes the steps of providing a substrate of semiconductor material upon which the integrated circuit can be formed. Forming a well of first conductivity type impurity in the substrate material, and forming a pair of spaced apart second regions of second opposite conductivity type impurity which are spaced apart by a portion of the well. The well cooperates with the pair of regions to define a conductive channel therein adjacent a surface of the substrate. And the channel has a channel length. A gate structure is provided overlying the conductive channel for controlling current conduction therein in response to voltage applied to the gate structure. A pair of second conductivity type impurity regions are formed to include a pair of finger portions underlying the channel and extending toward one another to define a second impurity depletion region therebetween of dimension less than the length of the channel.

According to the second aspect of the present invention, a method of making a MOS integrated circuit includes the steps of providing a semiconductor substrate, and forming adjacent N-well and P-well structures in the semiconductor material of the substrate. The N-well and P-well are formed to include respective conductivity types of impurity atoms and defining a diode junction. A respective sub-region is formed in each of said N-well and P-well adjacent to the diode junction and provide electrical connection to an active CMOS circuit element of the integrated circuit. One of the electrical connections is to ground potential. Both of the sub-regions are of the same conductivity type as the well in which they are formed, but have an impurity atom concentration differing from the respective wells. The impurity atoms used to form the sub-regions also are of differing electrical activity levels. One of the sub-regions is formed by a less-active impurity atom with a concentration of this impurity atom of not less than about $3\times10^{17}$ impurity atoms/cm$^3$. These sub-regions are used to define an intrinsic zener diode having a reverse bias breakdown voltage low enough to conduct an ESD surge current at a current level not causing damage to the substrate material, and having a reverse bias voltage level high enough to not interfere with the normal operation of the integrated circuit.

These and additional objects and advantages of the present invention will appear from a reading of the following detailed description of particularly preferred embodiments of the present invention, taken in conjunction with the appended drawing Figures, in which the same reference numeral refers to the same structural feature, or to features which are analogous in structure or function.

DETAILED DESCRIPTION OF THE PREFERRED EMBODIMENT

Figure 1:
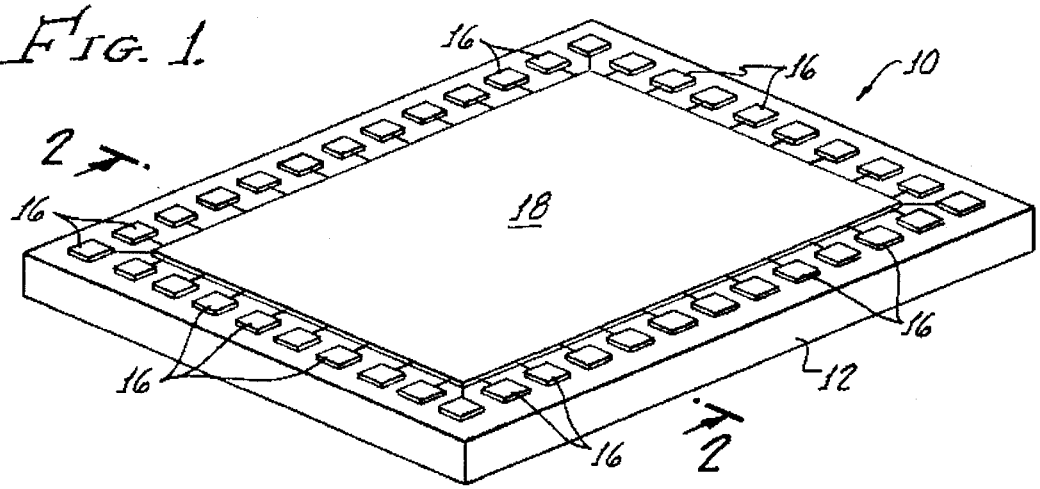
FIG. 1 provides an enlarged perspective view of an integrated circuit embodying the present invention.

Viewing FIG. 1, an integrated circuit die 10 is shown in perspective view. This circuit die 10 includes a substrate or chip 12 of silicon, and an integrated circuit structure 14 of metal oxide semiconductor (MOS) type. The circuit structure 14 includes a plurality of contact pads 16, which in the depicted circuit design, are disposed along the peripheral edges of the circuit 14. However, those ordinarily skilled in the pertinent arts will recognize that the contact pads 16 do not necessarily have to be located adjacent to the peripheral edges of the chip 12, but can be located else where, including in an active circuit element area of the integrated circuit 10. This integrated circuit 10 does include on the chip 12, an active circuit element area, which is designated with the numeral 18. In the area 18 a plurality of fine-dimension integrated circuit elements of various kinds are formed and interconnected in order to accomplish the design objectives for the circuit 10.

Figure 2:
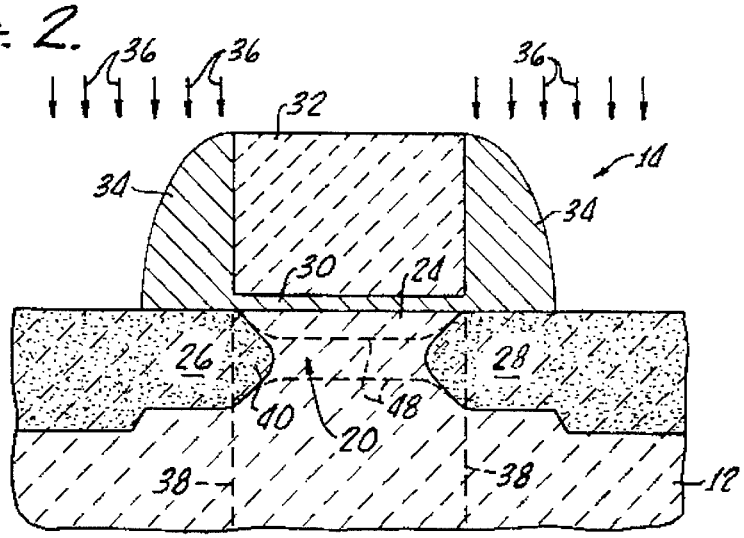
FIG. 2 provides a further enlarged fragmentary cross sectional view taken along line 2—2 of FIG. 1.

However, as those ordinarily skilled in the pertinent arts know, such integrated circuits are subject to damage to their fine-dimension integrated circuit elements by electrostatic discharge connecting to one or more of the contact pads 16. Such electrostatic discharge may occur, for example, during handling of the packaged integrated circuit 10 in preparation for its installation on a circuit board. Accordingly, in order to safeguard the circuit 10 from damage by such electrostatic discharge, a charge-dissipation or surge-current dispersed-charge permeation zone 20, as is depicted in FIG. 2, is formed in association with at least one of the contact pads 16, as will be further explained. The charge permeation zone 20 is formed by a laterally-spreading ion implantation of either boron for P-channel devices, or of phosphorous for N-channel devices, for example.

In both cases, the boron and phosphorous have a greater lateral dispersion than vertical penetration into the silicon of the chip 12. Consequently, as will be further explained, the boron or phosphorous atoms form a low density dopant (LDD) region which spreads laterally beneath an active circuit element of the circuit. This LDD provides a broad and deep charge carrier depletion zone in which charge carriers may convey the surge current from an electrostatic discharge as a dispersed charge of current level low enough that the substrate material is not damaged. Consequently, the integrated circuit 10 survives an electrostatic discharge event with no lasting damage, and with its functions intact.

Considering FIG. 2 in greater detail, it will be seen that a particular active circuit element 22 is depicted. The active circuit element 22 is an insulated gate type of field effect transistor (FET), and is associated at one of its source, or drain elements with at least one of the contact pads 16 of the chip 12. This FET 22 includes a channel region 24 of one conductivity type of doped silicon. Preferably, the channel region 24 is about 0.5 microns in length. At opposite sides of the channel region 24, the FET 22 includes source 26, and drain 28 regions of the opposite conductivity type of doped silicon. One of the source 26 of drain regions is connected to ground, or to a source of controlled voltage, $V_{ss}$. Overlying the channel region 24 is a thin layer of insulative oxide 30, and an area of polysilicon 32, which forms the gate for the FET. At opposite sides of the gate 32, a boundary 34 of TEOS material is provided.

FIG. 2 also shows schematically that the source and gate regions are formed by ion bombardment, as is depicted by the arrows 36. This ion bombardment may be conducted with boron atoms in the case of a P-channel device. For an N-channel device, phosphorous atoms will be used for the ion bombardment, and will be energized to a level of about 80 KeV. Preferably an implant dosage within the range of approximately $2 \times 10^{13}$ to $1 \times 10^{14}$ $P^+/cm^2$ is found to provide the best results. By the use of appropriate masking, the ion bombardment is conducted only to the left and right of the lines indicated at 38, viewing FIG. 2. The implanted phosphorous atoms form P⁻regions which serve as the source and drain 26, 28 of the FET. The determination of appropriate ion energies and implantation concentrations for use with boron implants are well within the skill of those ordinarily skilled in the pertinent art in view of the teaching of this invention. However, as mentioned above, the boron or phosphorous ions disperse or spread laterally more than they penetrate vertically into the silicon.

The result of this lateral spreading of the implanted ions is seen in FIG. 2 as "fingers" 40 of low dopant density extending toward one another below the channel 24 of the active circuit element 22. The fingers 40 bulge toward one another, and at a depth of closest approach to one another, are spaced considerably closer together than the length of the channel 24 of the FET 22. In other words, the length of the dispersed charge zone 20 is less than the length of the channel 24 of the associated FET 22. The depth of the closest approach of the fingers 40 to one another is about 100 nm below the upper surface of the silicon substrate. This is about 80 nm below the gate 32 for the source and drain 26, 28.

Between the fingers 40, the region 20 represents an effective dopant depletion zone of comparatively higher resistance into which charge carriers from the zones 40 may migrate under the influence of the applied voltage from an electrostatic discharge. However, because the relative doping level under the gate is less than the doping level near the interface, surge current punch through will occur through the dispersion zone 20 rather than through the channel 24 of the FET 22. This dispersed charge permeation zone 20 represents a much greater area or volume of material to carry the surge current from the electrostatic discharge than that of the channel 24.

Figure 4:
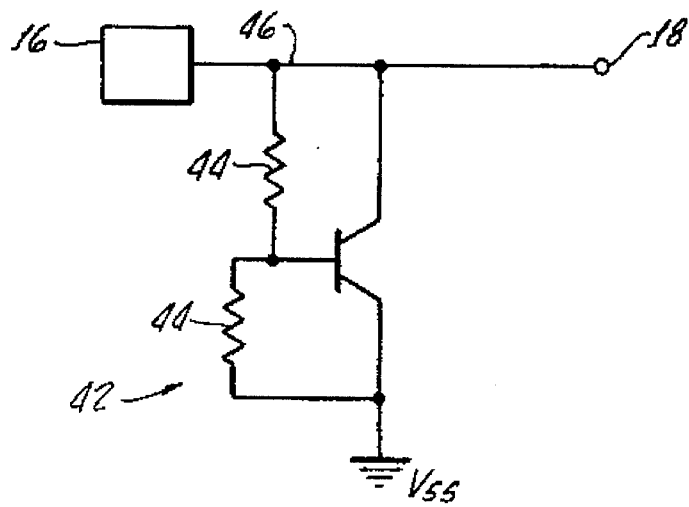
FIG. 4 schematically depicts a circuit diagram of the electrostatic discharge protection circuit provided by the circuit structures shown in FIGS. 1–3.

As a consequence of the presence of the fingers 40, the charge permeation area 20 depicted in FIG. 2 forms a dispersed surge-current distribution region in the substrate 12. This charge permeation area is schematically illustrated in FIG. 4 as a virtual lateral bipolar transistor 42 having its base connected to the contact pad 16 via a high impedance resistor 44, and having its collector connected to this same contact pad. The emitter of this bipolar transistor is connected to the ground, or $V_{ss}$ potential. Contact pad 16 also is connected to the integrated circuit elements 18, as is schematically illustrated by conductor 46. In the event that a high voltage electrostatic discharge in connected to the contact pad 16, the depletion region extending between the fingers 40 extends to contact one another, and the surge current is distributed in and permeates through the area 20, as is schematically illustrated in FIG. 2 by dashed lines 48.

As a result of the distribution of the charge in area 20 (lines 44) the localized charge density is low enough that the material of the substrate 12 is not damaged. The dielectric strength of the material 12 is not permanently penetrated by the surge current discharge so that a lower resistance path is create which would short the integrated circuit element 22. Instead, the surge current is dispersed, dissipated, and conducted to ground, or to the controlled voltage source $V_{ss}$, as was described above.

Figure 3:
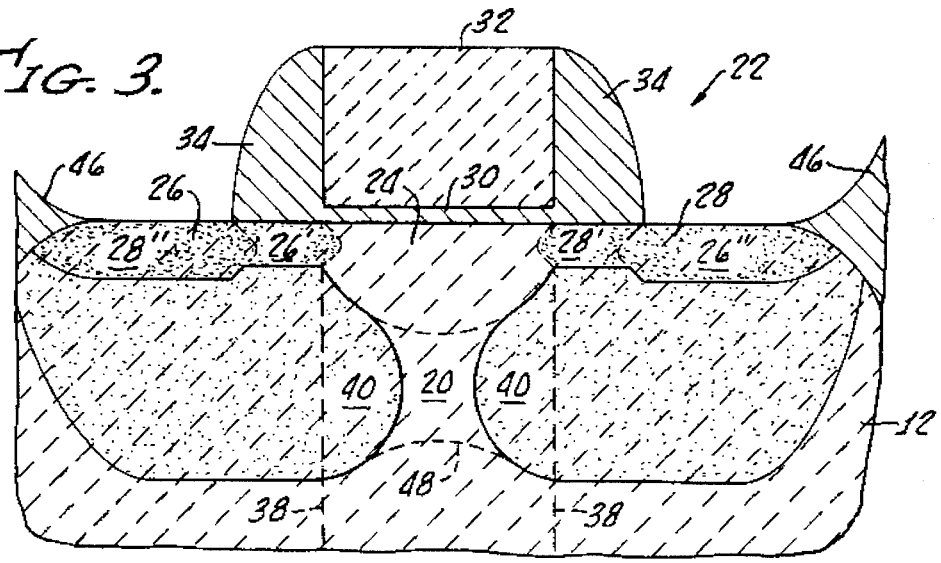
FIG. 3 shows a fragmentary cross sectional view similar to FIG. 2, and depicts an alternative embodiment of the present invention.

FIG. 3 depicts an alternative embodiment of the present invention. In order to obtain reference numerals for use in describing the embodiment of FIG. 3, features which are the same as or which are analogous in structure or function to those depicted and described above are referenced with the same numeral used above. In the embodiment of FIG. 3, the junctions, or source and drain structures of the FET 22, are shallow in comparison to those seen in FIG. 2. Consequently, the desired electrostatic discharge protection structure, with a larger, deeper, and more closely spaced charge distribution characteristic is achieved by a deep, low-dose ion implant. Viewing FIG. 3, it is seen that for an N-channel device, the phosphorous ions are implanted at a concentration of about $1\times10^{14}$ $P^+/cm^2$. The phosphorous ions are implanted at an energy level of about 240 KeV. An equivalent ion implantation can be carried out using boron ions for a P-channel device, as was pointed out above.

Viewing FIG. 3, it is seen that the source and drain regions 26, and 28, are only about half, or less, of the depth of the comparable structures seen in FIG. 2. Each of the source and drain regions 26, 28 include respective sub-regions which are designated 26', 26'', 28', and 28''. These sub-regions of the source and drain features are respectively doped with a lesser and a greater concentrations of dopant atoms than is the under lying finger portions 40 of the electrostatic discharge protection structure, as is further described. A portion of the field oxidation 46 of the device 10 is also seen in FIG. 3. However, the dispersed charge distribution zone 20 of FIG. 3 is larger than that seen in FIG. 2, although the dopant implantation is of lower concentration. The schematic circuit depiction of FIG. 4 applies equally to the structure seen in FIG. 3. In view of the above, it will be appreciated that the permeation of charge from an electrostatic discharge will occur more readily in devices of short channel lengths. This is contrary to conventional experience. However, exactly this behavior is observed in test devices made according to the structure of FIG. 2.

Figure 5:
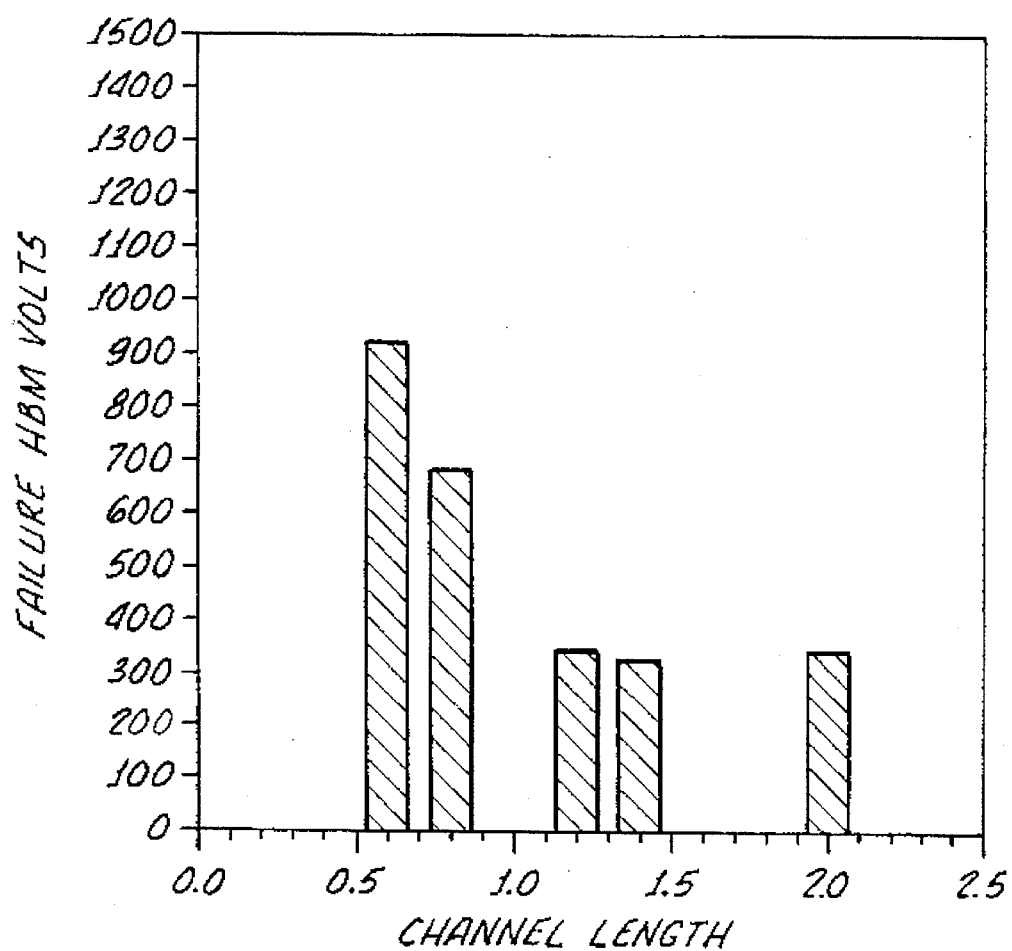
FIG. 5 graphically presents a voltage discharge characteristic of the circuit structures seen in FIGS. 1–3.
Figure 6:
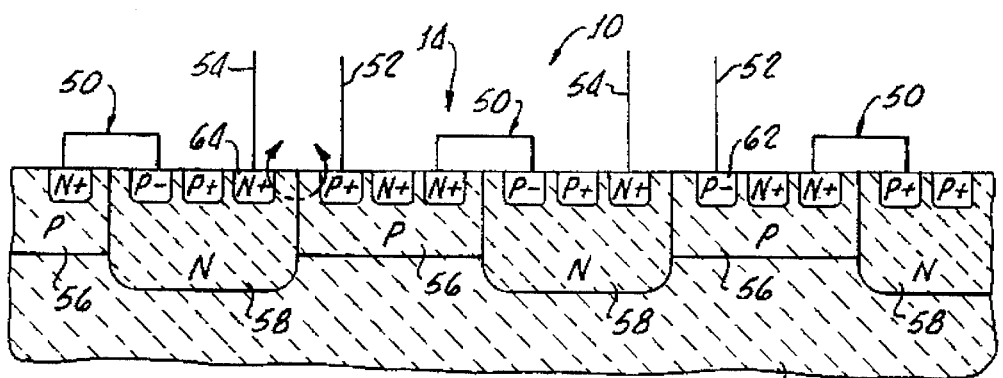
FIG. 6 provides a fragmentary cross sectional view of a MOS integrated circuit according to another aspect of the present invention.

The graph of FIG. 5 depicts the HBM voltage for experimental devices made according to the structure of FIG. 2, with a drain contact to gate distance of 2.2 microns, and a device width of 120 microns. The scale on the abscissa of FIG. 5 is the channel length of the device in microns. As those ordinarily skilled in the pertinent arts will appreciate, the embodiment of the present invention depicted in FIG. 2 provides a beneficial improvement in protection of the associated active circuit elements of the integrated circuit 10 from the adverse affects of electrostatic discharge.

Turning now to FIGS. 6–9, a MOS integrated circuit 10 is shown in fragmentary cross sectional view. This integrated circuit 10 includes a chip 12 with circuit elements 14 formed as a morphology on and adjacent to the surface of the chip 12. Considering the cross sectional view presented in FIG. 6, it is seen that the integrated circuit includes several FET's, which are generally referenced with the numeral 50, and which represent active circuit elements of the device. The contact pads which provide input and output to the device 10 are not seen in FIG. 6, however, lines 52 schematically represent the P-well electrical connections to the adjacent FET's, while lines 54 represent the N-well electrical connections to the respective FET's. Each of the FET's 50 has associated with it a P-well 56, and an N-well 58, which each represent basic impurity doping regions of the silicon material of the chip 12.

Figure 7A:
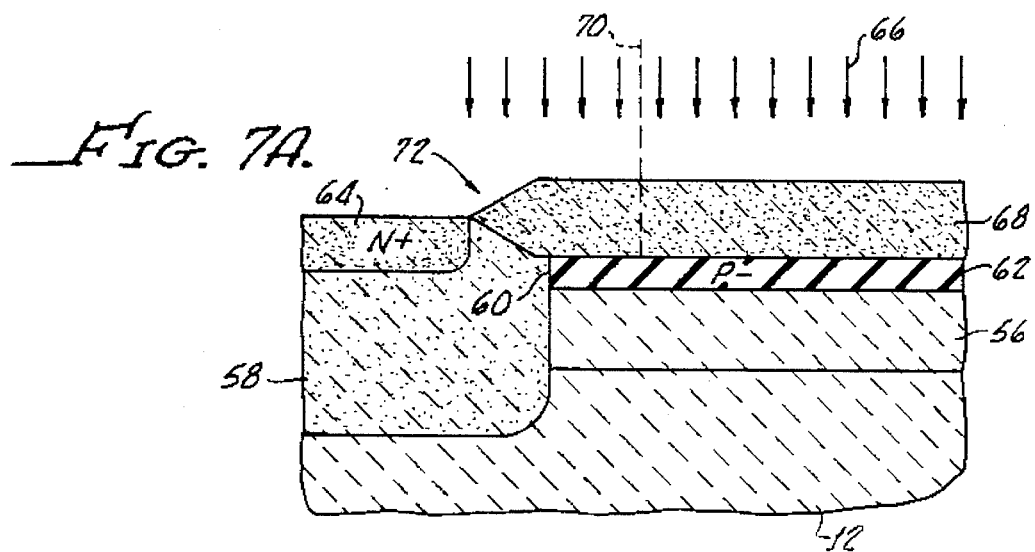
FIGS. 7A and 7B present alternative enlarged fragmentary cross sectional views of an encircled portion of FIG. 6.

As is seen in FIG. 7A, the adjacent N-wells and P-wells form respective junctions or interfaces 60. Within each respective P-well 56 and N-well 58, a respective region 62 and 64 is formed, and to which the respective electrical connections 52 and 54 are made for the MOS FET served by the particular connection lines, as noted above. The region 62 is a P⁻region, or a region having a lesser concentration of the positive charger carrier impurity used to create the P-well 56. The region 64, in contrast, is a N⁺region, or a region having an increased level of the negative charge carrier impurity used to create the N-well 58.

Conventionally, all CMOS integrated circuits have numerous P and N junctions. However, the junction illustrated in FIG. 7A is modified in at least one of two important ways in comparison to conventional CMOS integrated circuit structures to achieve an intrinsic zener diode characteristic which protects the device 10 from ESD. A large voltage drop (i.e., an ESD event) on an input or output contact pad of a CMOS device forces a large surge current through a CMOS drain. Because the surge current is confined to the drain, localized joule heating of the silicon material occurs. This joule heating melts the silicon, and imposed damage which persists after the ESD event is over. However, the damage will have permanently changed or destroyed the electrical characteristics of the associated CMOS. The present invention works to prevent such damage to a CMOS from an ESD event by reducing the amount of current that can be confined to the drain of the CMOS devices. Joule heating of the silicon is thus reduced to below the level that can cause permanent damage to the devices. The behavior of the present intrinsic zener diode can be tailored so that an ESD event triggers zener breakdown and the surge current is safely conducted to ground across a wide area of silicon with attendant low current density.

The intrinsic zener diode connects the electrical connections 52 and 54 one to the other in an ESD event. One of the connections 52 and 54 connects to ground, or to a source of controlled electrical potential to which surge current from an ESD event may be conducted. On the one hand, the circuit 10 has its N⁺region 64 formed with an arsenic implant level of about $4\times10^{15}$ $As^+/cm^2$, at an ion implantation energy of about 80 KeV. This region has a depth of about 150 nm. The P⁻region 62 is formed by an ion bombardment of the silicon substrate 12, which is schematically depicted with the arrows 66.

Preferably, the ion bombardment 66 is conducted using boron atoms, as will be further explained. A field oxidation layer 68, which is a part of the completed MOS integrated circuit 10, would not be present or would be present only in an abbreviated form during the ion bombardment to form the implant 62. Those ordinarily skilled in the pertinent arts will recognize further that the ion bombardment 66 is preferably conducted with appropriate silicon nitride shields on the substrate for protecting the areas where the active devices are to be formed, and with appropriate masking. For this reason, a dashed line 70 represents a demarkation between the area over implant 62 where ion bombardment is conducted and an area over implant 64 where the ion bombardment is stopped by a suitable mask (not shown).

In contrast to conventional MOS integrated circuits in which the P⁻implant would not be expected to ever exceed an implant dopant concentration level of about $5\times10^{16}$ $B^+/cm^3$, the ion implantation of the P⁻region 62 is carried out so that this region has a impurity atom concentration of at least $3\times10^{17}$ $B^+/cm^3$. Preferably, the implant region 62 has an impurity atom concentration of about $5\times10^{17}$ $B^+/cm^3$. This boron ion bombardment necessary to produce the implant region 62 is preferably carried out using boron atoms at an energy level of about 20 to 50 KeV, and with an intensity of about $5\times10^{12}$ $B^+/cm^2$.

Figure 8:
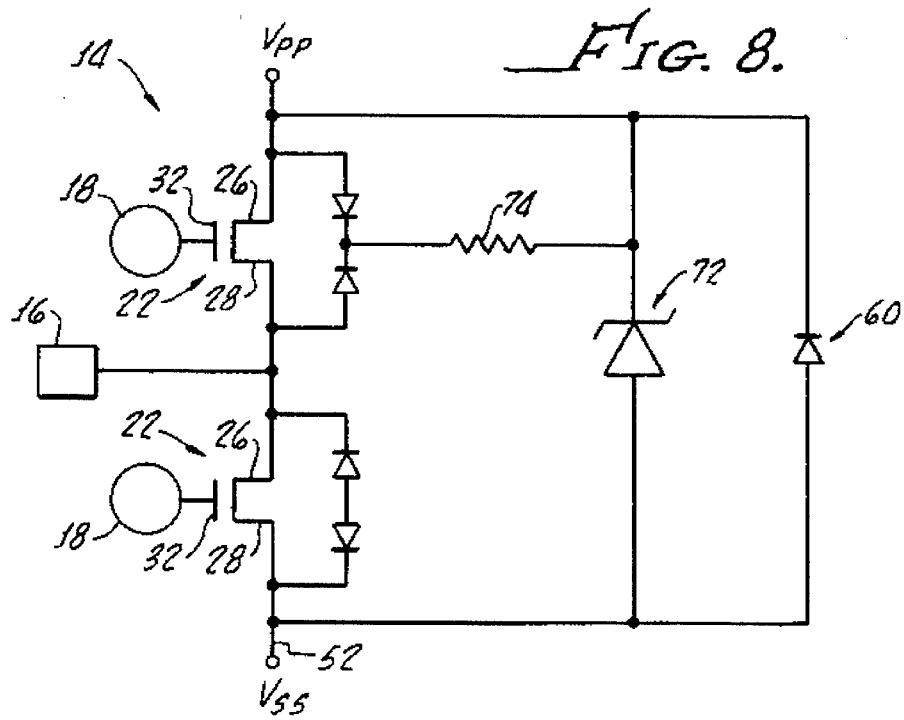
FIG. 8 provides a schematic representation of the equivalent zener ESD circuit provided by the structural morphology seen in FIGS. 6–7B.
Figure 9:
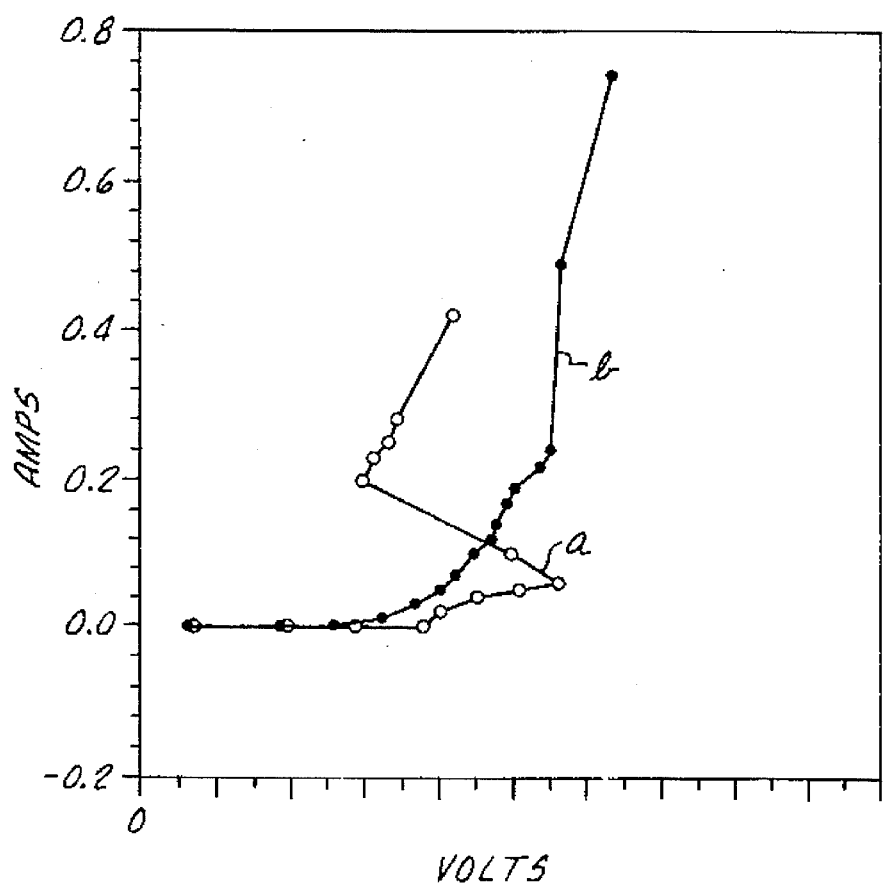
FIG. 9 provides a graphical representation of a current-versus-voltage characteristic of the zener-type ESD circuit provided by the present invention.

The result is represented schematically in FIG. 8, and graphically in FIG. 9. FIG. 8 shows the equivalent circuit which is created by the more highly doped P⁻region 62 of the present invention in combination with the N⁺region 64. These two regions in combination define an intrinsic zener diode, 72, which protects the adjacent active circuit elements 14, as well as the rest of the integrated circuit structure, which is schematically referenced in FIG. 8 with the numeral 18. A resistor 74 is also represented by the inherent resistance present between the zener 72 and the one adjacent active MOS FET served by the adjacent connector 54.

As those ordinarily skilled in the pertinent arts will recognize, the junction 60 defines a diode, which is also referenced on the schematic of FIG. 8 with this same reference numeral. However, the reverse current breakdown voltage of the diode 60 would be too high to provide any effective ESD protection for the integrated circuit 10, as is indicated with line "a" on FIG. 9. Further, the reverse current breakdown mechanism for such a diode is ordinarily avalanching. If such a diode is made with a sufficiently low reverse bias breakdown voltage to protect an integrated circuit, the avalanching results in very high localized surge current levels, and destruction of the silicon substrate.

On the other hand, as the graphical depiction of FIG. 9 points out, the present invention provides an intrinsic zener diode 72 with a "soft" reverse bias breakdown at a sufficiently low voltage to provide ESD protection for the circuit 10. This lower reverse bias voltage level and softer breakdown voltage characteristic of the intrinsic zener diode 72 are represented on FIG. 9 by the line "b". With this intrinsic zener diode, the breakdown mechanism is predominantly tunneling because of the much higher dopant level provided in the P‾region 62. Accordingly, localized current levels are low enough that damage to the silicon substrate 12 does not result from an ESD event, and the integrated circuit 10 is protected and is not damaged.

Figure 7B:
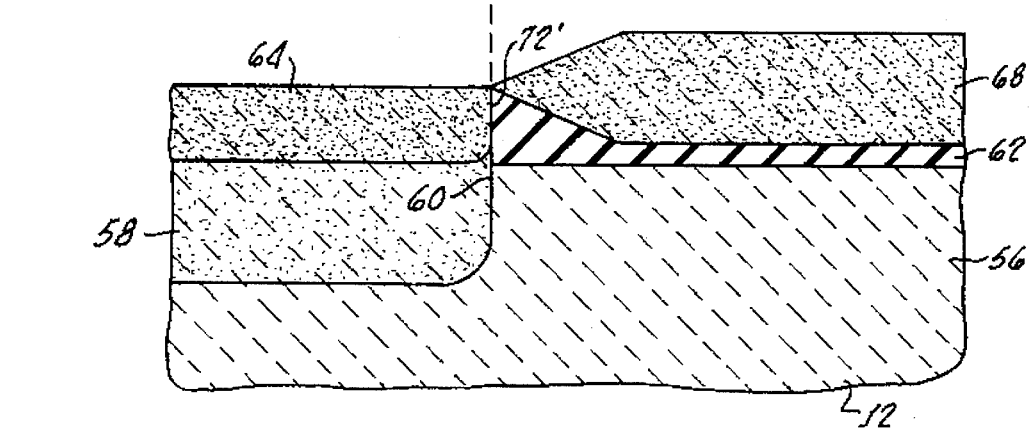

FIG. 7B shows the other important way in which the present integrated circuit structure may be altered with respect to conventional CMOS technology to achieve the ESD protection desired for the present invention. In order to obtain reference numerals for use in describing FIG. 7, features which are the same or which are analogous in structure or function to those described above are referenced on FIG. 7B using the same numeral used previously. Viewing now FIG. 7B, an integrated circuit 10 is presented, which in fragmentary cross section appears much like that depicted in FIG. 7A. However, as closer examination shows, the dashed line 70 which indicates the demarcation effected by successive masking operations which are used to limit first the implant for region 64, and then for region 62, is shifted toward the region 64 with respect to the more conventional spacing apart of these implants as seen in FIG. 7A. In other words, and as FIG. 7B shows, the ion bombardment 66 is shifted leftwardly viewing this drawing Figure, so that it forms implant 62 with a junction 72' with the region 64. The regions 62 and 64 then actually touch one another rather than being spaced slightly apart, as depicted in FIG. 7A. The operation of the structure depicted in FIG. 7B is in all other respects the same as that described above with respect to FIG. 7A.

While the present invention has been depicted, described, and is defined by reference to particularly preferred embodiments of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

We claim:

1. A method of making an integrated circuit device with improved protection from electrical discharges, said method including the steps of:

providing a substrate of a semiconductor material upon which said integrated circuit is to be formed;

forming a well of first conductivity type impurity in said substrate material;

forming source and drain regions of second opposite conductivity type impurity which are spaced apart by a portion of said well, said well cooperating with said source and drain regions to define a conductive channel therein adjacent a surface of said substrate and having a channel length;

providing a gate structure overlying said conductive channel for controlling current conduction therein in response to voltage applied to said gate structure;

forming a pair of second conductivity type impurity regions which underlie said source and drain regions respectively and include a pair of finger portions underlying said channel and extending toward one another to define an impurity depletion region therebetween of dimension less than said channel length, wherein:

said second conductivity type impurity regions are formed by bombarding said substrate material with phosphorous atom energized to an ion energy level of about 240 KeV and a dose of about $1 \times 10^{14}$ ions/cm$^2$.

2. The method of claim 1, further comprising forming a source contact and a drain contact above said source and drain regions respectively.

3. The method of claim 1, in which said source and drain regions are formed by bombarding said substrate material with phosphorous atoms.

4. A method of making an integrated circuit device with improved protection from electrical discharges, said method including the steps of:

providing a substrate of a semiconductor material upon which said integrated circuit is to be formed;

forming a well of first conductivity type impurity in said substrate material;

forming source and drain regions of second opposite conductivity type impurity which are spaced apart by a portion of said well, said well cooperating with said pair of regions to define a conductive channel therein adjacent a surface of said substrate and having a channel length;

providing a gate structure overlying said conductive channel for controlling current conduction therein in response to voltage applied to said gate structure; and forming a pair of second conductivity type impurity regions which underlie said source and drain regions respectively and include a pair of finger portions underlying said channel and extending toward one another to define an impurity depletion region therebetween of dimension less than said channel length, wherein:

said second conductivity type impurity regions are formed by bombarding said substrate material with ions at an energy level and concentration that are selected such that said impurity depletion region becomes electrically conductive only in response to an electrostatic discharge (ESD) event to conduct an ESD surge current therethrough.

5. The method of claim 4 wherein said second conductivity type impurity regions are formed by ion bombardment of said substrate with an ion characteristically having a lateral dispersion which matches or exceeds its vertical dispersion in the substrate material.

6. The method of claim 5 wherein said second conductivity type impurity regions are formed by ion bombardment of said substrate with ions of an element selected from the group including boron and phosphorous.

* * * * *